(12) United States Patent
Hasson et al.

(10) Patent No.: US 7,336,753 B2
(45) Date of Patent: Feb. 26, 2008

(54) TRANSMITTER

(75) Inventors: Jaime Hasson, Ganei Tikva (IL); Ilan Barak, Kfar Saba (IL)

(73) Assignee: Marvell International Ltd., Hamilton (BM)

( * ) Notice: Subject to any disclaimer, the term of this patent is extended or adjusted under 35 U.S.C. 154(b) by 855 days.

(21) Appl. No.: 10/603,860

(22) Filed: Jun. 26, 2003

(65) Prior Publication Data

US 2004/0266365 A1    Dec. 30, 2004

(51) Int. Cl.
   *H03D 3/24* (2006.01)
(52) U.S. Cl. .................................... 375/376; 327/127
(58) Field of Classification Search ............... 375/373, 375/376, 295; 332/126, 127
   See application file for complete search history.

(56) References Cited

U.S. PATENT DOCUMENTS

| | | | |
|---|---|---|---|
| 3,777,275 A | 12/1973 | Cox | |
| 4,063,199 A | 12/1977 | Oursler, Jr. | |
| 4,433,312 A | 2/1984 | Kahn | |
| 4,439,744 A | 3/1984 | Kumar et al. | |
| 4,965,531 A * | 10/1990 | Riley | 331/1 A |
| 5,012,200 A | 4/1991 | Meinzer | |
| 5,264,807 A | 11/1993 | Okubo et al. | |
| 5,295,162 A | 3/1994 | Zarembowitch | |
| 5,302,914 A | 4/1994 | Arntz et al. | |
| 5,345,189 A | 9/1994 | Hornak et al. | |
| 5,420,541 A | 5/1995 | Upton et al. | |
| 5,541,554 A | 7/1996 | Stengel et al. | |
| 5,548,246 A | 8/1996 | Yamamoto et al. | |
| 5,568,094 A | 10/1996 | Bowen et al. | |
| 5,621,351 A | 4/1997 | Puri et al. | |
| 5,661,434 A | 8/1997 | Brozovich et al. | |
| 5,694,093 A | 12/1997 | DaSilva et al. | |
| 5,724,005 A | 3/1998 | Chen et al. | |
| 5,739,723 A | 4/1998 | Sigmon et al. | |
| 5,758,269 A | 5/1998 | Wu | |
| 5,786,727 A | 7/1998 | Sigmon | |
| 5,786,728 A | 7/1998 | Alinikula | |
| 5,854,571 A | 12/1998 | Pinckley et al. | |
| 5,862,460 A | 1/1999 | Rich | |
| 5,872,481 A | 2/1999 | Sevic et al. | |
| 5,880,633 A | 3/1999 | Leizerovich et al. | |
| 5,886,575 A | 3/1999 | Long | |
| 5,901,346 A | 5/1999 | Stengel et al. | |
| 5,903,854 A | 5/1999 | Abe et al. | |
| 5,909,643 A | 6/1999 | Aihara | |
| 5,929,702 A | 7/1999 | Myers et al. | |
| 5,974,041 A | 10/1999 | Kornfeld et al. | |
| 6,008,703 A | 12/1999 | Perrott et al. | |
| 6,133,788 A | 10/2000 | Dent | |

(Continued)

FOREIGN PATENT DOCUMENTS

WO    WO 99/52206    10/1999

OTHER PUBLICATIONS

"Parallelism exploitation is SAR data compression methods", Beatriz Botero, Nourredine Hifdi, EUSAR 2000, Munich, Allemagne, May 23-25, 2000.

(Continued)

*Primary Examiner*—Kevin Kim

(57) ABSTRACT

Briefly, a transmitter that includes first and second fractional N synthesizers that may generate outphased modulated signals. First and second sigma-delta modulators may control the modulation of the first and second fractional N synthesizers.

19 Claims, 3 Drawing Sheets

U.S. PATENT DOCUMENTS

| | | | |
|---|---|---|---|
| 6,147,653 | A | 11/2000 | Wallace et al. |
| 6,181,920 | B1 | 1/2001 | Dent et al. |
| 6,201,452 | B1 | 3/2001 | Dent et al. |
| 6,271,782 | B1 | 8/2001 | Steensgaard-Madsen |
| 6,285,251 | B1 | 9/2001 | Dent et al. |
| 6,330,455 | B1 | 12/2001 | Ichihara |
| 6,480,703 | B1 * | 11/2002 | Calderone et al. .......... 455/118 |
| 6,587,511 | B2 | 7/2003 | Barak et al. |
| 6,633,199 | B2 | 10/2003 | Nielsen et al. |
| 6,636,112 | B1 | 10/2003 | McCune |
| 6,754,287 | B2 | 6/2004 | Underbrink et al. |
| 6,825,719 | B1 | 11/2004 | Barak et al. |
| 6,888,580 | B2 * | 5/2005 | Dujmenovic ................ 348/731 |
| 2001/0030581 | A1 * | 10/2001 | Dent ......................... 330/297 |
| 2002/0136341 | A1 * | 9/2002 | Huh et al. .................. 375/376 |
| 2003/0125065 | A1 | 7/2003 | Hasson et al. |
| 2003/0206056 | A1 | 11/2003 | Hietala |
| 2004/0218699 | A1 * | 11/2004 | Carsello .................... 375/343 |

OTHER PUBLICATIONS

Peric et al.,"Design of Signal Constellations for Gaussian Channal by Using Iterative Polar Quantization", Electrical Conference, 1998 MELECON 98., 9th Mediterranean, vol. 2, May 18-20, 1998 pp. 866-869 vol. 2 Digital Object Identifier.

T. A. D. Riley and M. A. Copeland, "A simplified continuous phase modulator technique," IEEE Trans. on circuits and systems, vol. 41, No. 5, pp. 321-328, May 1994.

N. M. Filiol, T.A. Riley, C. Plett and M. A. Copeland, "An aglie ISM band frequency synthesizer with built-in GMSK data modulation," IEEE Journal of Solid-State Circuits, vol. 33, No. 7, pp. 998-1008, Jul. 1998.

M. H. Perrot, T. L. Tewksbury III, C. G. Sodini, "A 27-mw CMOS Fraction-N Synthesizer Using Digital Compensation for 2.5-Mb/s GFSK Modulation", IEEE Journal of Solid-State Circuits, vol. 32, No. 12, pp. 2048-2060, Dec. 1997.

B. Stengel, "LINC—Linear technology transmitter review," International Microwave Symposium 2000, Jun. 2000, pp. 1-32.

D.L. Neuhoff, "Polar quantization revisited", IEEE International Symposium on Information Theory, 1997 Proceedings, pp. 60, 1997.

N.O. Sokal, "RF Power Amplifiers, Classes A through S—How they operate, and when to use each", Electronics Industries Forum of New England, Professional Program Proceedings, pp. 179-183,, 1997.

T. Yamaji, A. Yasuda, H. Tanimoto, Y. Suzuki, "A Digital-to-RF Converter Architecture Suitable for a Digital-to-RF Direct-Conversion Software Defined Radio Transmitter", IEICE Trans. Commun., vol. E83-B, No. 6, pp. 1254-1260, Jun. 2000.

Michael H. Perrott et al., "A Modeling Approach for $\Sigma$-$\Delta$ Fractional-$N$ Frequency Synthesizers Allowing Noise Analysis", IEEE Journal of Solid-State Circuits, vol 37, No. 8, Aug. 2002, pp. 1028-1038.

M.H. Perrott, "Techniques for High Data Rate modulation and Low Power Operation of Fractional-N Frequency Synthesizers", PH.D Disseration, MIT, Sep. 1997, Retrieved from the Internet, URL:http://www-mtl.mit.edu/{perrott/pages/thesis.pdf/, pp. 1-90.

Zhang et al., "Multibit Oversampled Sigma—Delta A/D Converter with Nonuniform Quantisation", Electronics Letters, Mar. 14, 1991, UK, vol. 27, No. 6, pp. 528-529.

Fredrick H. Raab, "Efficiency of Outphasing RF Power-Amplifier Systems", IEEE Transactions on Communications. vol. Com-33, No. 10, Oct. 1985, pp. 1094-1099.

Steve C. Cripps, "RF Power Amplifiers for Wireless Communications", 1999, USA, pp. 219-250.

D.C. Cox, "Linear Amplification with Nonlinear Components", IEEE Transactions on Communications, Dec. 1974, pp. 1942-1945.

Bob Stengel and William R. Eisenstadt, "LINC Power Amplifier Combiner Method Efficiency Optimization", IEEE Transaction on Vehicular Technology. vol. 49, No. 1, Jan. 2000, pp, 229-234.

S. A. Hetzel et al., "A LINC Transmitter", University of Bristol, IEEE, 1999, pp. 133-137.

S. O. Ampem-Darko, H.S. Al-Raweshidy, "A Novel Technique for Gain/Phase Error Cancellation in LINC Transmitters", 1999 IEEE , pp. 2034-2038.

J. Nieznanski, "Performance characterization of vector sigma-delta modulation", IECON '98, Proceedings of the 24th Annual Conference of the IEEE, vol. 1, pp. 531-536, 1998.

U.S. Appl. No. 10/131,750 filed Apr. 24, 2002, Barak et al.

* cited by examiner

TRANSMITTER

BACKGROUND OF THE INVENTION

Mobile stations (MS), handheld devices, base stations (BS), access points (AP) and other devices of wireless communication system may include transmitters to transmit radio frequency (RF) signals. The transmitters may be linear transmitter, outphasing transmitters, and the like. Transmitters that are used to transmit a continuous phase modulation signals, such as, for example, Continuous Phase Frequency Shift Keying (CPFSK) signals, Gaussian Minimum Shift Keying (GMSK) signals, and the like, may include a fractional-N synthesizer with a built-in data modulator. However, in these transmitters, the quantization noise power spectral density may grow with frequency.

Thus, there is a need for better ways to mitigate the disadvantages described above.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features and advantages thereof, may best be understood by reference to the following detailed description when read with the accompanied drawings in which:

Figure 1:
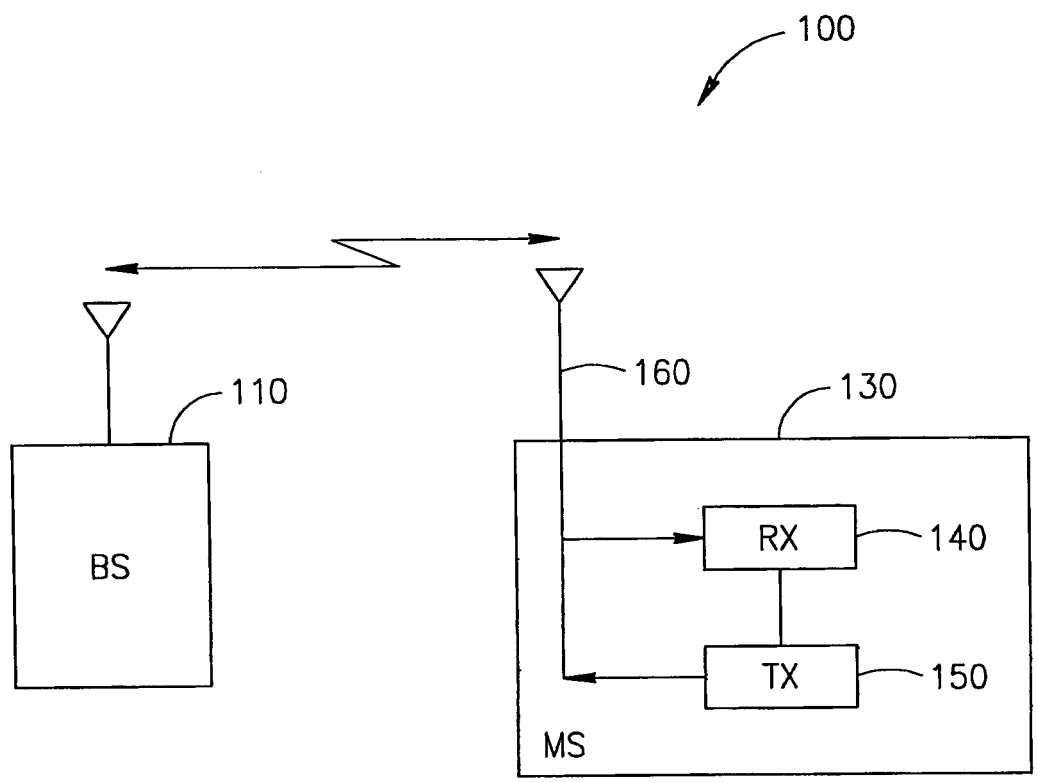
FIG. 1 is a schematic illustration of a wireless communication system that may be used in conjunction with a transmitter according to an exemplary embodiment of the present invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF EMBODIMENTS OF THE INVENTION

In the following detailed description, numerous specific details are set forth in order to provide a thorough understanding of the invention. However it will be understood by those of ordinary skill in the art that the present invention may be practiced without these specific details. In other instances, well-known methods, procedures, components and circuits have not been described in detail so as not to obscure the present invention.

Some portions of the detailed description, which follow, may be presented in terms of algorithms and symbolic representations of operations on data bits or binary digital signals within a computer memory. These algorithmic descriptions and representations may be the techniques used by those skilled in the data processing arts to convey the substance of their work to others skilled in the art.

Unless specifically stated otherwise, as apparent from the following discussions, it is appreciated that throughout the specification discussions utilizing terms such as "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

It should be understood that the present invention may be used in a variety of applications. Although the present invention is not limited in this respect, the circuits and techniques disclosed herein may be used in many apparatuses such as receivers of a radio system. Receivers intended to be included within the scope of the present invention include, by way of example only, wireless local area network (WLAN) receivers, two-way radio receivers, digital system receivers, analog system receivers, cellular radiotelephone receivers and the like.

Types of cellular radiotelephone transmitters intended to be within the scope of the present invention include, although not limited to, Code Division Multiple Access (CDMA) and wide band CDMA (W-CDMA) cellular radiotelephone transmitters for transmitting spread spectrum signals, Global System for Mobile communication (GSM) cellular radiotelephone transmitters, Time Division Multiple Access (TDMA) transmitters, Extended-TDMA (E-TDMA), General Packet Radio Service (GPRS), Extended GPRS transmitters for transmitting amplitude modulated (AM) and phase modulated signals, and the like.

Turning to FIG. 1, a wireless communication system 100, for example, a Cellular communication system, is shown. Although the scope of the present invention is not limited in this respect, the exemplary Cellular communication system 100 may include an at least one base station (BS) 110 and an at least one mobile station (MS) 130. Mobile station 130 may include a receiver 140, a transmitter 150, and an antenna 160, for example, an omni-directional antenna, a highly-directional antenna, a steerable antenna, a dipole antenna, and the like.

In some embodiments of the present invention, transmitter 150 may include universal transmitter architecture to support digital data transmission. Although the scope of the present invention is not limited in this respect, the universal transmitter architecture may combine a linear amplification technique using non-linear components (LINC) with direct modulation through fractional-N synthesizers. In some embodiments of the invention, a fractional-N synthesizer with a sigma-delta modulator may provide a desired transmit frequency by controlling the density of appearance of "+1" and/or "−1" signals according to a direct current (DC) value related to the desired transmit frequency, if desired.

Although the scope of the present invention is not limited in this respect, the sigma-delta modulators may provide "+1" and/or "−1" signals with a digital word. The digital word may include one or more bits. In embodiments of the present invention, the sigma-delta modulators may be implemented by hardware, by software, or by any suitable combination of hardware and software.

Figure 2:
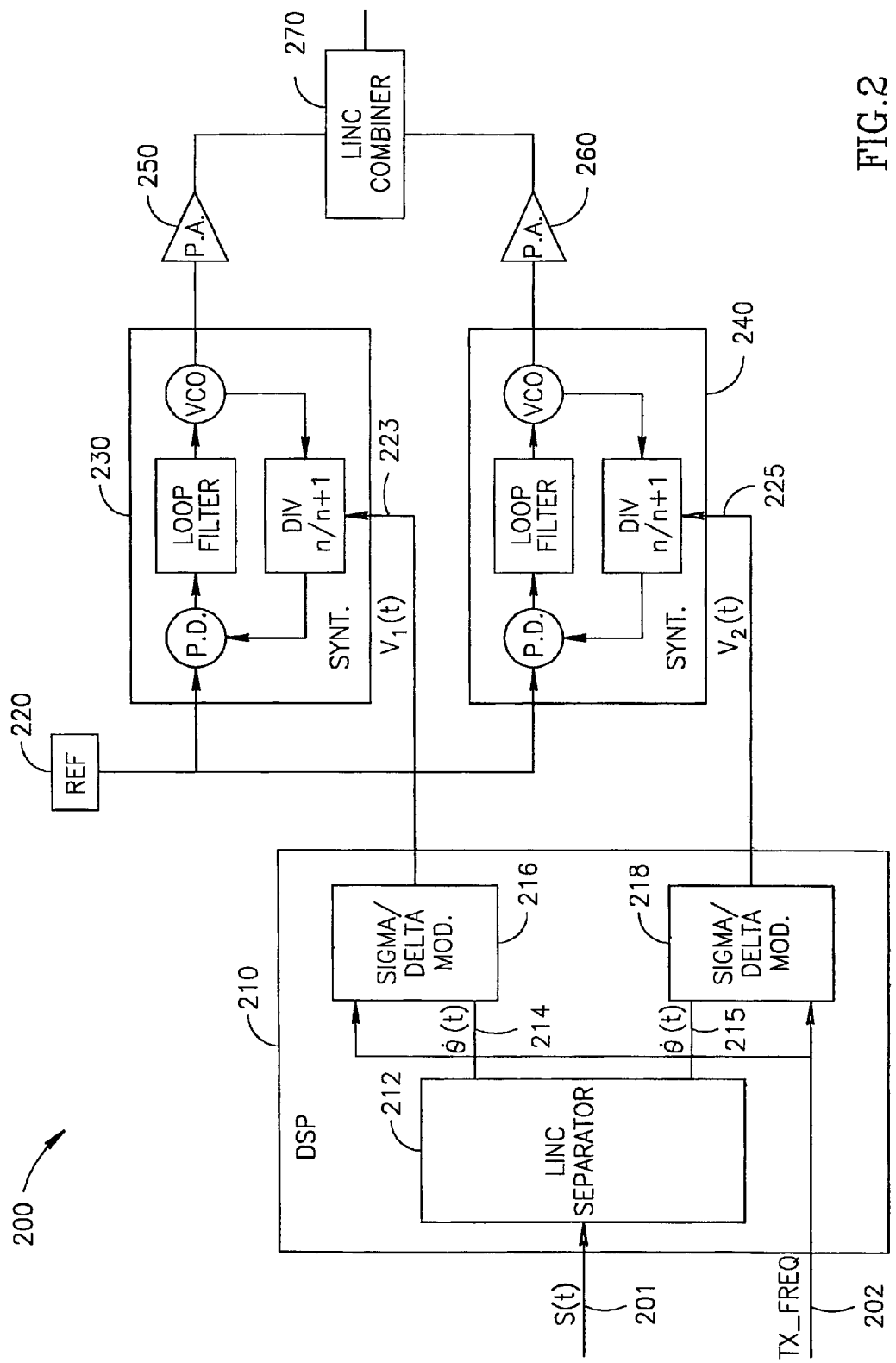
FIG. 2 is a block diagram of a transmitter according to an exemplary embodiment of the present invention.

Turning to FIG. 2, a block diagram of a transmitter 200 according to an exemplary embodiment of the present invention is shown. Although the scope of the present invention is not limited in this respect, transmitter 200 may include a digital signal processor (DSP) 210, a reference oscillator 220, synthesizers 230, 240, power amplifiers 250, 260 and a combiner 270.

Although the scope of the present invention is not limited in this respect, an input signal 201, denoted s(t), may be provided to transmitter 200. For example, input signal 201 may be an analog signal or a digital signal and may be described as follows:

$$s(t) = A_c \cos\left[w_c t + D_f \int_{-\infty}^{t} m(\tau)d\tau\right]$$

wherein:
  $A_c$ may represent the transmitted amplitude;
  $w_c$ may be the transmitted frequency;
  $D_f$ may be the deviation index; and
  m(t) may represent the baseband digital signal.

In some embodiments of the invention, a phase of signal s(t) may be proportional to the integral of m(t), if desired.

Although the scope of the present invention is not limited in this respect, input signal 201, for example, an amplitude variable complex baseband signal, may be inputted to separator 212, for example, a LINC separator or the like. Separator 212 may generate two constant envelope signals (not shown) based on the instantaneous amplitude of the input signal. The constant envelope signals may be shifted in phase, for example, the phase of a first signal 214 may be 0 degrees and the phase of a second signal 215 may be 90 degrees, if desired. Furthermore, the constant envelope signals may be depicted as follows:

$$s_1(t) = \frac{A(t)}{2}(\cos(\omega_o(t) + \phi(t) + \theta(t))$$

$$s_2(t) = \frac{A(t)}{2}(\cos(\omega_o(t) + \phi(t) - \theta(t))$$

wherein, A(t) (e.g., amplitude) and θ(t) (e.g., phase) are functions of $P_T$ (e.g., power level) and a(t). For example, to generate two constant envelope signals, A(t) and θ(t) may be selected as follows:

$$A(t) = k > \max(\sqrt{P_T} \, a(t)) \text{ and } \theta(t) = \cos^{-1}\left(\frac{\sqrt{P_T} \, a(t)}{k}\right)$$

Although the scope of the present invention is not limited in this respect, separator 212 may provide sigma-delta modulators 216 and 218 with digital signals 214, 215, respectively, which may relate to phase derivatives $\dot{\theta}_1(t)$ and $\dot{\theta}_2(t)$ of signals $s_1(t)$ and $s_2(t)$, respectively.

Although the scope of the present invention is not limited in this respect, in this exemplary embodiment of the present invention, sigma-delta modulators 216 and 218 and separator 212 may be implemented by software within DSP 210. However, in alternative embodiments of the present invention, sigma-delta modulators 216 and 218 and separator 212 may be implemented by hardware and/or by a combination of hardware and software, and the like.

Although the scope of the present invention is not limited in this respect, a DC signal 202 that may be related to a desired power level of the transmitted frequency signal may be inputted to sigma-delta modulators 216 and 218. Sigma delta modulators 216, 218 may combine DC signal 202 with signals 214 and 215 (e.g. derivatives of the phase of signal 201) to provide control signals 223, 225 to synthesizers 230, 240, respectively. For example, control signals 223, 225 may include digital words of one or more bits based on the implementation needs of different embodiments of the present invention.

Although the scope of the present invention is not limited in this respect, sigma-delta modulators 216, 218 may modulate an instantaneous frequency of synthesizers 230, 240 synthesizers, respectively, based on a desired power level of a transmitted frequency. Synthesizers 230 and 240 may be fractional-N synthesizers, if desired. Reference oscillator 220 may provide a reference signal to synthesizers 230, 240. Synthesizers 230, 240 may modulate portions of signal s(t) 201 based on control signals 223, 225, respectively, and may generate respective phase shifted, adjusted, RF signals. Synthesizers 230, 240 may provide the RF signals to power amplifiers 250, 260, respectively. For example, power amplifiers (PA) 250, 260 may be saturated PA's, if desired. Combiner 270, for example, a reactive termination combiner, a transmission line combiner, a Wilkenson combiner, a transformer combiner, and the like, may reconstruct the RF signal to provide a transmitted signal with a power level substantially equal to the desired power level of the transmitted frequency.

Figure 3:
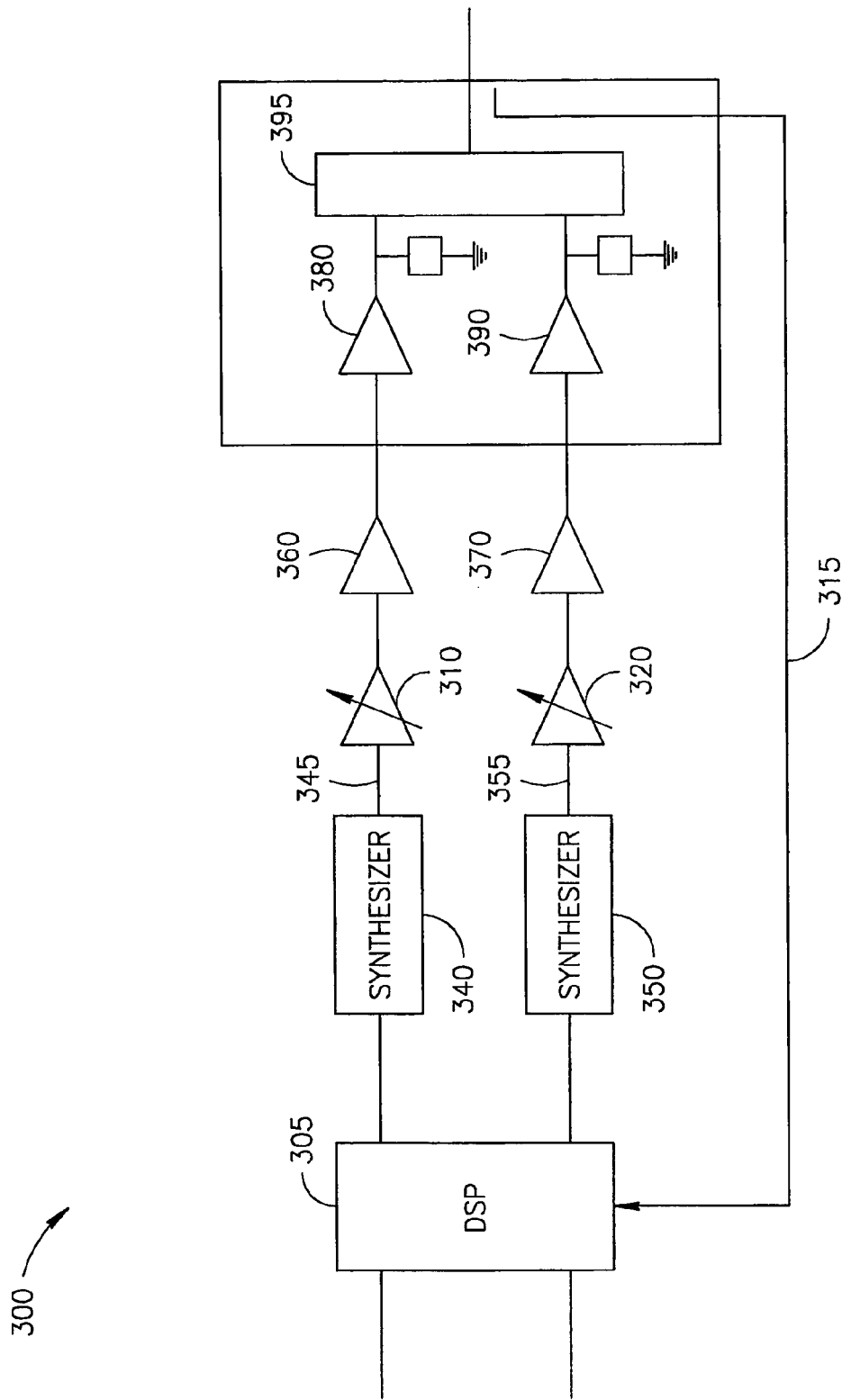
FIG. 3 is a block diagram of a transmitter according to another exemplary embodiment of the present invention.

Turning to FIG. 3, a block diagram of a transmitter 300 according to another exemplary embodiment of the present invention is shown. Although the scope of the present invention is not limited in this respect, the architecture and operation of transmitter 300 may be similar to those of transmitter 200. This exemplary embodiment further includes variable gain amplifiers 310, 320, between synthesizers 340, 350 and PA's 360, 370, respectively, and branch amplifiers 380, 390 with a reactive termination combiner 395.

Although the scope of the present invention is not limited in this respect, synthesizers 340, 350 may be fractional-N synthesizers and/or phase modulated synthesizers. In this example, DSP 305 may control the modulation of synthesizers 340, 350 and the gains of branch amplifiers 310, 320. However, in alternative embodiments of the invention, other processors or controllers may adjust the gains of branch amplifiers 310, 320 to adjust the amplitudes of the outphased modulated signals 345, 355. The adjustment may be based on a desired power level, if desired.

Although the scope of the present invention is not limited in this respect, in alternative embodiments of the present invention, transmitter 300 may include a feedback loop. For example, a feedback signal 315 (shown with a dotted line) from an output signal of reactive termination combiner 395 to a DSP 305 may be used, if desired.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. An apparatus comprising:
  first and second fractional-N synthesizers to provide first and second, respective, modulated outphased signals; and
  first and second sigma-delta modulators operably coupled to the first and second fractional-N synthesizers, respectively, wherein the first and second sigma-delta modulators are configured to modulate the first and second fractional-N synthesizers, respectively;
  wherein one or both of the first and second sigma-delta modulators are configured to adjust an instantaneous frequency of one or both of the first and second fractional-N synthesizers, respectively, based on a desired power level of a transmitted frequency.

2. The apparatus of claim 1, further comprising a combiner to combine the first and second modulated outphased signals and to provide a radio frequency transmission signal having a power level substantially equal to the desired power level of the transmitted frequency.

3. The apparatus of claim 2, wherein the combiner comprises a reactive termination combiner associated with an adjustable amplifier.

4. The apparatus of claim 1, further comprising first and second variable gain amplifiers to adjust amplitudes of the first and second modulated outphased signals, respectively.

5. An apparatus comprising:
first and second fractional-N synthesizers to provide first and second, respective, modulated outphased signals;
a digital signal processor that includes the first and second sigma-delta modulator modules to control an instantaneous frequency of the first and second fractional-N synthesizers, respectively, based on a desired transmitted frequency; and
a separator module to provide first and second phase derivatives to the first and second sigma-delta modulator modules, respectively.

6. An apparatus comprising:
first and second fractional-N synthesizers to provide first and second, respective, modulated outphased signals;
first and second sigma-delta modulators operably coupled to the first and second fractional-N synthesizers, respectively, wherein the first and second sigma-delta modulators are configured to modulate the first and second fractional-N synthesizers, respectively; and
a separator to provide first and second phase derivatives to the first and second sigma-delta modulators.

7. A method comprising:
separating an input signal into first and second phase-shifted signals;
generating first and second outphased signals by first and second fractional-N synthesizers, respectively, wherein the generating comprises modulating the first and second outphased signals using first and second sigma-delta modulators to generate modulated outphased signals, respectively; and
providing first and second phase derivatives of phases of the first and second phase-shifted signals, respectively, to the first and second sigma-delta modulators, respectively.

8. The method of claim 7, further comprising:
combining the first and second modulated outphased signals; and
providing a transmission signal based on said combining of said modulated outphased signals.

9. The method of claim 7, further comprising varying the amplitudes of the first and second modulated outphased signals.

10. A wireless communication system comprising:
a base station to transmit a desired power level value of a transmitted signal; and
a mobile station comprising a transmitter having first and second fractional-N synthesizers to provide first and second modulated outphased signals, respectively, and first and second sigma-delta modulators operably coupled to the first and second fractional-N synthesizers, respectively, to modulate the first and second outphased signals based on the desired power level value of the transmitted signal;
wherein one or both of the first and second sigma-delta modulators are able to adjust an instantaneous frequency of one or both of the first and second fractional-N synthesizers, respectively, based on a desired power level of a transmitted frequency.

11. The wireless communication system of claim 10, wherein the transmitter further comprises a combiner to combine the first and second modulated outphased signals and to provide a radio frequency transmission signal having a power level substantially equal to the desired power level of the transmitted frequency.

12. The wireless communication system of claim 11, wherein the combiner comprises a reactive termination combiner and an adjustable amplifier.

13. The wireless communication system of claim 10, further comprising first and second variable amplifiers to adjust amplitudes of the first and second outphased modulated signals, respectively.

14. A wireless communication system comprising:
a base station to transmit a desired power level value of a transmitted signal;
a mobile station comprising a transmitter having first and second fractional-N synthesizers to provide first and second modulated outphased signals, respectively, first and second sigma-delta modulators operably coupled to the first and second fractional-N synthesizers, respectively, to modulate the first and second outphased signals based on the desired power level value of the transmitted signal, and a digital signal processor that includes the first and second sigma-delta modulator modules to control an instantaneous frequency of the first and second fractional-N synthesizers, respectively, based on a desired transmitted frequency.

15. The wireless communication system of claim 14, wherein the digital signal processor comprises a separator module to provide first and second phase derivatives to the first and second sigma-delta modulators modules, respectively.

16. A wireless communication system comprising:
a base station to transmit a desired power level value of a transmitted signal; and
a mobile station comprising a transmitter having first and second fractional-N synthesizers to provide first and second modulated outphased signals, respectively, first and second sigma-delta modulators operably coupled to the first and second fractional-N synthesizers, respectively, to modulate the first and second outphased signals based on the desired power level value of the transmitted signal, and a separator to provide first and second phase derivatives to the first and second sigma-delta modulators.

17. An article comprising a storage medium, having stored thereon instructions that, when executed, result in:
separating an input signal into first and second phase-shifted signals;
generating first and second outphased signals by first and second fractional-N synthesizers, respectively;
modulating the first and second outphased signals using first and second sigma-delta modulators, respectively, to provide modulated outphased signals; and
providing first and second phase derivatives of phases of the first and second phase-shifted signals, respectively, to first and second sigma-delta modulators, respectively.

18. The article of claim 17, wherein the instructions of providing, when executed, further result in:
  combining the first and second modulated outphased signals; and
  providing a transmission signal based on said combining of said modulated outphased signals.

19. The article of claim 17, wherein the instructions of providing, when executed, further result in:
  varying the amplitudes of the first and second modulated outphased signals.

* * * * *